United States Patent
Derat et al.

(10) Patent No.: US 10,830,805 B2
(45) Date of Patent: Nov. 10, 2020

(54) METHOD, SYSTEM AND COMPUTER PROGRAM FOR CORRECTING A RADIATION PATTERN

(71) Applicant: Rohde & Schwarz GmbH & Co. KG, Munich (DE)

(72) Inventors: Benoit Derat, Munich (DE); Gerhard Hamberger, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 102 days.

(21) Appl. No.: 16/195,576

(22) Filed: Nov. 19, 2018

(65) Prior Publication Data
US 2020/0158768 A1    May 21, 2020

(51) Int. Cl.
*G01R 29/10*    (2006.01)

(52) U.S. Cl.
CPC .................................. *G01R 29/105* (2013.01)

(58) Field of Classification Search
None
See application file for complete search history.

(56) References Cited

U.S. PATENT DOCUMENTS

| | | | |
|---|---|---|---|
| 10,177,863 B1* | 1/2019 | Koebele | H04B 17/102 |
| 10,209,284 B2* | 2/2019 | Gienger | H01Q 3/267 |
| 10,484,106 B2* | 11/2019 | Garcia | H04B 17/12 |
| 10,564,201 B1* | 2/2020 | Shaffer | G01R 29/0885 |
| 2018/0375594 A1* | 12/2018 | Kildal | H01Q 15/14 |
| 2019/0101579 A1* | 4/2019 | Rowell | G01R 29/0871 |
| 2019/0393968 A1* | 12/2019 | Ioffe | H04B 17/15 |
| 2020/0007245 A1* | 1/2020 | Abadie | H04B 17/29 |
| 2020/0088775 A1* | 3/2020 | Anton | H04B 17/21 |

* cited by examiner

*Primary Examiner* — Jermele M Hollington
(74) *Attorney, Agent, or Firm* — Christensen O'Connor Johnson Kindness PLLC

(57) ABSTRACT

A method for correcting a radiation pattern is described by using a system having a device under test with at least one antenna and a measurement antenna. The device under test is located in a placement zone. A radiation pattern of the device under test is measured. A corrected measurement antenna pattern is determined to compensate for an offset of the at least one antenna of the device under test with respect to a coordinate center of the placement zone towards which the measurement antenna is orientated. The corrected measurement antenna pattern is applied on the measured radiation pattern of the device under test to obtain a corrected radiation pattern of the device under test. Furthermore, a system and a computer program for correcting a radiation pattern are described.

18 Claims, 2 Drawing Sheets

METHOD, SYSTEM AND COMPUTER PROGRAM FOR CORRECTING A RADIATION PATTERN

FIELD OF THE DISCLOSURE

Embodiments of the present disclosure relate generally to a method for correcting a radiation pattern. Moreover, embodiments of the present disclosure relate generally to a system for correcting a radiation pattern. Furthermore, embodiments of the present disclosure relate generally to a computer program for correcting a radiation pattern.

BACKGROUND

In the state of the art, over-the-air measurements (OTA measurements) of a device under test with an antenna are performed in the far-field to characterize the receiving and/or transmission properties of the device under test. The radiation pattern of the device under test, in particular its antenna, is measured via a measurement antenna of the system used for testing the device under test. To reduce any errors during the measurements, in particular longitudinal taper errors, the antenna of the device under test is located at the center of the coordinate system towards which the measurement antenna is orientated.

Typically, those far-field OTA measurements are performed at high costs because large direct far-field anechoic chambers are used which accommodate the device under test as well as the measurement antenna to ensure that the respective measurements of the device under test are done in the far-field.

To reduce the overall costs, it is tried to minimize the far-field testing distance between the device under test and the measurement antenna resulting in smaller chambers. For instance, software near-field transformations are used wherein the amplitude and phase of the respective radiation pattern are measured in the near-field. Then, transformation algorithms are applied to transform the measured near-field characteristics into far-field characteristics used for characterizing the receiving and/or transmission properties of the device under test in the far-field. However, high computational power is required to execute the respective algorithms. Furthermore, phase information of the radiation pattern has to be measured which is required by the transformation algorithms for transforming the measured near-field characteristics into the far-field characteristics being of interest.

Moreover, indirect far-field methods are known in the state of the art which are also called hardware near-field transformations. According to these methods, the near-field of the radiation pattern is distorted by hardware components to accelerate the space-convergence to the far-field such that larger quiet zones are created that fully encompass the device under test. However, the additional hardware components required increase the costs.

Accordingly, there is a need for a cost-efficient possibility to measure a radiation pattern of the device under test.

SUMMARY

Embodiments of the present disclosure provide a method for correcting a radiation pattern by using a system comprising a device under test with at least one antenna and a measurement antenna, with the following steps:

Locating the device under test in a placement zone, the at least one antenna of the device under test being located in the far-field;

Measuring a radiation pattern of the device under test received via the measurement antenna;

Determining a corrected measurement antenna pattern to compensate for an offset of the at least one antenna of the device under test with respect to a coordinate center of the placement zone towards which the measurement antenna is orientated; and Applying the corrected measurement antenna pattern on the measured radiation pattern of the device under test to obtain a corrected radiation pattern of the device under test.

Further, embodiments of the present disclosure provide a system for correcting a radiation pattern, comprising a placement zone, a measurement antenna, a control and processing module as well as a device under test with at least one antenna, wherein at least the measurement antenna is connected with the control and processing module that is configured to:

measure a radiation pattern of the device under test received via the measurement antenna;

determine a corrected measurement antenna pattern to compensate for an offset of the at least one antenna of the device under test with respect to a coordinate center of the placement zone towards which the measurement antenna is orientated; and apply the corrected measurement antenna pattern on the measured radiation pattern of the device under test to obtain a corrected radiation pattern of the device under test.

Moreover, embodiments of the present disclosure provide a computer program for correcting a radiation pattern using a system with a placement zone, a measurement antenna, a control and processing module as well as a device under test with at least one antenna, the computer program comprising a program code being adapted to cause the system to perform the following steps when the computer program is run on the control and processing module:

measuring a radiation pattern of the device under test received via the measurement antenna;

determining a corrected measurement antenna pattern to compensate for an offset of the at least one antenna of the device under test with respect to a coordinate center of the placement zone towards which the measurement antenna is orientated; and applying the corrected measurement antenna pattern on the measured radiation pattern of the device under test to obtain a corrected radiation pattern of the device under test.

Accordingly, a "centered" radiation pattern of the device under test is achieved because the measured radiation pattern of the device under test is corrected appropriately by the corrected measurement antenna pattern to compensate the occurring offset between the antenna of the device under test (DUT), also called DUT antenna, as well as the coordinate center of the placement zone.

Initially, it is assumed that the DUT antenna is placed in the coordinate center so that the measurement points for measuring the radiation pattern of the device under test are assigned to the coordinate center. In fact, a coordinate surface is established on which the measurement points are located, which surrounds the coordinate center in a symmetrical manner. However, the device under test cannot be located in such a precise manner due to several facts so that the offset may occur resulting in a "displaced" radiation pattern of the device under test being measured which has to be corrected.

Put another way, the effects caused by the off-centered antenna with respect to the coordinate center of the placement zone are at least partly compensated by applying the corrected measurement antenna pattern on the measured radiation pattern. Hence, the measurement antenna is orientated towards the "displaced" antenna of the device under test once the corrected measurement antenna pattern is applied.

The characteristics of the measurement antenna differ with any deviation from its initial orientation towards the coordinate center of the placement zone. At least these differing characteristics are compensated in an appropriate manner while the corrected measurement antenna pattern is applied. In other words, the wrong orientation of the measurement antenna is corrected that occurs due to the off-centered antenna of the device under test with respect to the coordinate center of the placement zone.

Generally, the measurement antenna may also be called probe as the measurement antenna is used for probing the radiation pattern of the device under test, namely its respective antenna.

Accordingly, errors in direct far-field measurement(s) of the device under test can be compensated which occur when the antenna of the device under test is not located at the center of the respective coordinate system, namely at the coordinate center towards which the measurement antenna is orientated initially. The error compensation ensures better performance with respect to the measurement(s).

Put another way, the relative orientation of the measurement antenna with respect to the antenna of the device under test changes during the measurement(s) of the device under test due to the fact that the antenna of the device under test is off-centered. Thus, various angular regions of the measurement antenna pattern contributes to the respective measurement(s), namely transmission measurement(s) and/or receiving measurement(s), because at least one of the measurement antenna and the device under test rotates during the measurement(s). These variations are inter alia compensated when applying the corrected measurement antenna pattern. Hence, variations due to the measurement pattern with the measurement angle are compensated appropriately.

In fact, the compensation may also be called probe correction as the measurement antenna corresponds to the probe.

For instance, the center of the placement zone may define the coordinate center of the placement zone, namely the center of the underlying coordinate system.

The respective measurements are done in the far-field, in particular the direct far-field.

According to an aspect, a vector between the measurement antenna and the at least one antenna of the device under test is calculated. The vector may describe the relative orientation of both antennas with respect to each other in Cartesian coordinates. This vector may be used at least indirectly for determining the measurements points in a coordinate system assigned to the real location of the antenna of the device under test and/or the measurement antenna. Thus, the vector may be used at least indirectly for determining the corrected measurement antenna pattern.

The vector may be calculated by taking the offset of the antenna of the device under test with respect to the coordinate center as well as the distance between the measurement antenna and the coordinate center into account. This distance may be known or calculated. The vector may start from the (off-centered) antenna of the device under test pointing towards the measurement antenna.

According to another aspect, spherical coordinates are calculated defining the relative orientation between the measurement antenna and the at least one antenna of the device under test being off-centered with respect to the coordinate center. The spherical coordinates may be calculated based on the vector calculated previously. However, the spherical coordinates may also be calculated directly because the absolute position(s) of the measurement antenna and the antenna of the device under test are only required for calculating the relative orientation in spherical manner. The spherical coordinates ensure that the measurements points can be defined in a spherical manner with respect to a coordinate system that is assigned to the real location of the antenna of the device under test and/or the measurement antenna.

The spherical coordinates enable the calculation of the corrected measurement antenna pattern because the relative orientation between the emitting antenna and receiving antenna is defined in a spherical manner as well as the radiation pattern of the measurement antenna.

Particularly, the corrected measurement antenna pattern corresponds to the difference between a measurement antenna boresight gain and the measurement antenna pattern at the spherical coordinates calculated. In fact, the gain loss of the measurement antenna due to the angular variance caused by the off-centered antenna of the device under test is inter alia compensated by the corrected measurement antenna pattern. In other words, the corrected measurement antenna pattern compensates the different radiation characteristics assigned to the angular offset between the measurement antenna and the antenna of the device under test.

As already mentioned, the measurement antenna is orientated towards the coordinate center of the placement zone to which the antenna of the device under test is located in a displaced manner. The corrected measurement antenna pattern applied ensures that the measurement antenna is (mathematically) orientated towards the real location of the antenna of the device under test. In other words, the radiation pattern of the measurement antenna is turned towards the antenna of the device under test in a mathematical manner.

Another aspect provides that a coordinate system transformation is done by which measurement points are transformed from a coordinate system with the coordinate center of the placement zone to another coordinate system with an antenna coordinate center. The antenna coordinate center may be the one of the measurement antenna. In other words, the measurement radiation pattern has its antenna coordinate center at the location of the measurement antenna. Hence, the angular variation(s) of the measurement antenna can be taken into account and compensated appropriately that are caused by the off-centered antenna of the device under test.

Moreover, the antenna coordinate center may be the one of the antenna of the device under test, namely the DUT antenna. Thus, the location of the antenna of the device under test is corrected. Typically, it is assumed that the position of the antenna of the device under test coincidences with the coordinate center of the placement zone being the origin of the initial coordinate system used for determining the radiation pattern of the device under test. Thus, the different measurement points establishing a grid that surrounds the coordinate center of the placement zone in a spherical manner.

However, an occurring offset of the device under test, in particular its antenna, with respect to the coordinate center leads to errors during the measurement(s). The offset and the assigned errors can be compensated by transforming the coordinate system used for calculating or rather determining the radiation pattern. Thus, the respective measurement points of the grid are also transformed.

Put another way, the assumed location of the DUT antenna, namely the antenna of the device under test, is corrected by the real one while using the appropriate coordinate system after the coordinate system transformation. Hence, the spherical coordinates are transformed from the coordinate system having its origin in the coordinate center of the placement zone to the coordinate system having its origin at the real location of the DUT antenna.

In other words, a geometrical compensation is applied so that measurement data acquired, namely the measured radiation pattern, on a coordinate surface, for instance a sphere, surrounding the device under test displaced by the offset is transformed to a coordinate surface, for instance a sphere, that is centered around the antenna of the device under test.

According to another aspect, the radiation pattern of the device under test obtained after the coordinate system transformation is interpolated to obtain a regular grid of measurement points. The coordinate system transformation may lead to different points on the respective coordinate surface, in particular a different density of measurement points. This is compensated by interpolating techniques. As discussed above, the coordinate system transformation yields the coordinate surface, for instance a sphere, centered around the antenna of the device under test wherein the individual points on that coordinate surface are interpolated to obtain a regular grid of points over the respective coordinate surface, in particular the surface of the sphere centered around the antenna of the device under test.

The corrected radiation pattern of the device under test obtained is at least one of interpolated and extrapolated to obtain a regularly spaced grid of measurement points. Hence, a regularly spaced grid of points is obtained that define the corrected radiation pattern of the device under test.

For instance, the interpolation is done by a natural function whereas the extrapolation is done in a linear manner.

Furthermore, a path loss due to the offset of the at least one antenna of the device under test with respect to the coordinate center of the placement zone may be determined, wherein the path loss is compensated in the corrected radiation pattern of the device under test. The path loss occurs due to the offset resulting in a larger distance between the measurement antenna and the antenna of the device under test. In fact, the additional distance yielding the path loss corresponds to the offset viewed from the measurement antenna. The occurring path loss may be calculated by using Friis transmission equation.

The path loss may also be compensated so as to obtain a further corrected radiation pattern of the device under test.

For instance, the path loss is compensated while at least one of applying the corrected measurement antenna pattern on the measured radiation pattern of the device under test to obtain the corrected radiation pattern of the device under test and doing the coordinate system transformation. In other words, the path loss is compensated while doing the coordinate system transformation and/or applying the corrected measurement antenna pattern on the measured radiation pattern of the device under test to obtain the corrected radiation pattern of the device under test. Thus, the path loss may already be compensated while performing the coordinate system transformation mentioned above. Alternatively, the path loss compensation is done when the corrected measurement pattern is applied on the measured radiation pattern of the device under test.

The radiation pattern of the device under test may be measured on a spherical grid. The spherical grid of points describing the measurement points can be adapted easily because the respective relationships are defined by spherical coordinates determined. In fact, the coordinate system transformation can be done in a simple manner.

The measurement system may have a positioning system that comprises at least one of a movable arm and a turntable. The device under test may be turned or rather rotated during the respective measurement(s) due to the turntable, also called rotating disc, that is assigned to the placement zone.

Moreover, the measurement antenna may be disposed at a movable arm. The movable arm is also called rotating gantry arm. Hence, at least the elevation angle can be set during the measurement(s) via the movable arm.

Another aspect provides that the distance between the measurement antenna and the coordinate center of the placement zone is constant during the measurement. As mentioned above, the coordinate center of the placement zone may be assigned to the center of the placement zone that may coincidence with the rotation axis of the turntable so that the distance between the center of the placement zone and the measurement antenna remains constant.

The measurement may be performed with signals having a frequency higher than 6 GHz, particularly higher than 27 GHz.

Moreover, only amplitude information may be taken into account. Thus, no phase information is required for correcting the radiation pattern of the off-centered antenna of the device under test. Hence, it is not necessary to determine the phase center of the antenna of the device under test. In fact, the relation between the antenna of the device under test and its phase center is assumed to be known.

According to another aspect, an asymmetric measurement antenna pattern is made symmetrical. The asymmetric measurement antenna pattern results from the angular variation due to the offset of the antenna of the device under test with respect to the coordinate center. However, this asymmetric relation is compensated by the corrected measurement antenna pattern.

Only a single measurement antenna may be used for measuring the radiation pattern. Hence, no antenna array is necessary that may be used in the state of the art for providing far-field conditions in distances lower than the Fraunhofer distance of the respective single antenna element(s).

Generally, the transmitting properties as well as the receiving properties of the device under test may be measured. In both scenarios, the offset of the antenna of the device under test is compensated appropriately.

In fact, a coordinate system transformation takes place so that the origin of the respective coordinate system is moved from the coordinate center of the placement zone, namely the initial coordinate system, to the real location of the antenna of the device under test. In other words, the assumed location of the antenna of the device under test is corrected. This ensures that angular variations of the radiation pattern of the device under test are taken into account while determining the corrected radiation pattern.

In addition, an interpolation takes place (interpolation from new grid of points to original grid of points).

Furthermore, the path loss is compensated that occurs due to the longer distance between the measurement antenna and the antenna of the device under test because of the offset, namely the off-centered antenna with respect to the initial coordinate system.

In addition, the differences of the radiation pattern of the measurement antenna that occur due to the wrong orientation towards the coordinate center are also compensated because the corrected measurement antenna pattern is determined and applied. The corrected measurement antenna pattern corresponds to the difference between the boresight antenna pattern achieved by correct orientation and the measurement antenna pattern at the spherical coordinates describing the relative orientation between the measurement antenna and the off-centered antenna of the device under test.

In total, a centered radiation pattern of the device under test is obtained that takes all error mechanisms into account that occur and may influence the radiation pattern measured due to the off-centered antenna of the device under test. These error mechanisms relate to a coordinate system offset, path length differences as well as deviations from boresight direction of the measurement antenna pattern.

Because the path loss as well as the measurement pattern are taken into account, in particular after the coordinate system transformation, the respective error mechanisms are compensated.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
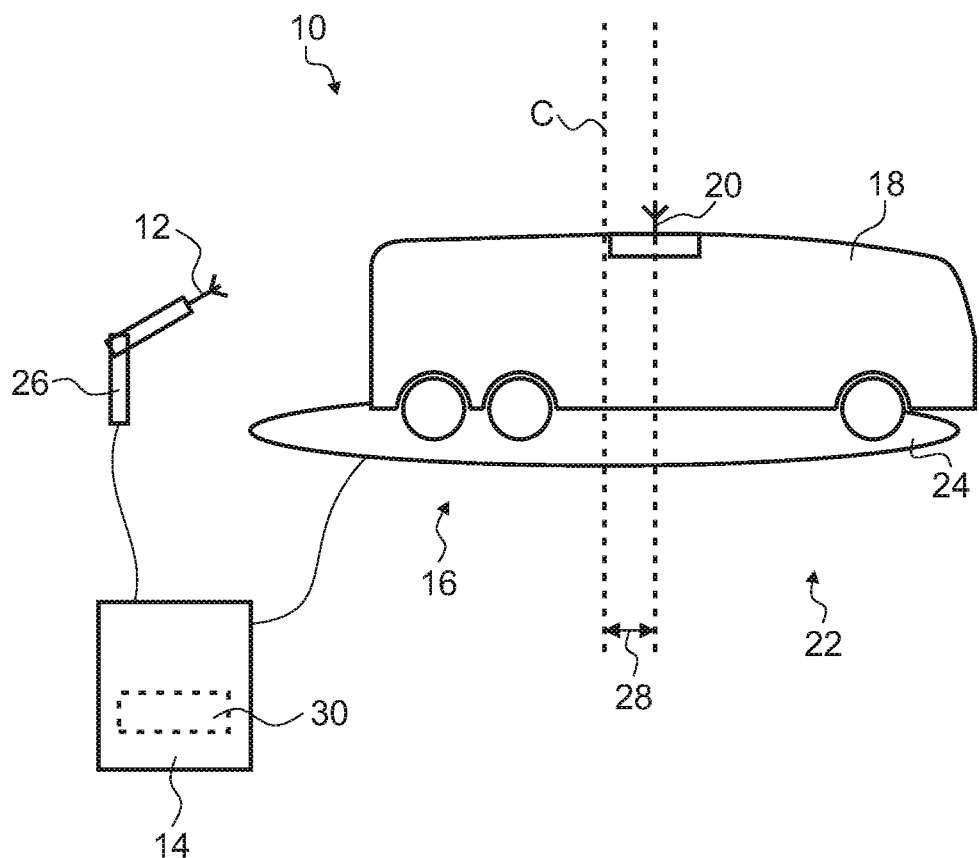
FIG. 1 schematically shows a system according to the present disclosure.

In FIG. 1, a system 10 for correcting a radiation pattern is shown, which comprises a measurement antenna 12 that is connected to a control and processing module 14 being part of the system 10.

The system 10 further comprises a placement zone 16 in which a device under test 18 is placed that has at least one antenna 20, in particular several antennas 20.

For instance, the device under test 18 is a car, a bus as shown, a boat, an airplane or any other large object that is difficult to be placed in a desired manner within the placement zone 16, namely with its antenna centered in the placement zone 16.

In case of several antennas 20 assigned to the device under test 18, it becomes obvious that it is not possible to locate the device under test 18 in the placement zone 16 so that all antennas 20 are located at the center of the placement zone 16.

The device under test 18, in particular the at least one antenna 20, is located in the direct far-field of the measurement antenna 12 so that electromagnetic waves are exchanged between the at least one antenna 20 and the measurement antenna 12 according to far-field conditions.

The whole setup may be assigned to an anechoic chamber for shielding any disturbing signals and/or interferences.

Moreover, the system 10 comprises a positioning system 22 that is assigned to the placement zone 16. The positioning system 22 is configured to adapt the relative orientation of the device under test 18, in particular the at least one antenna 20, with respect to the measurement antenna 12 during measurement of the respective characteristics of the device under test 18.

For this purpose, the positioning system 22 may comprise a turntable 24, also called rotating disk, that is assigned to the placement zone 16. Hence, the device under test 18 placed on the turntable 24 can be rotated during the measurement(s).

Moreover, the positioning system 22 has a moveable arm 26 to which the measurement antenna 12 is assigned. The moveable arm 26 is also called rotating gantry arm. Particularly, the measurement antenna 12 is disposed at the moveable arm 26 so that the measurement antenna 12 can be moved appropriately. The moveable arm 26, particularly the measurement antenna 12, may be moved by means of the control and processing module 14 to adapt an elevation angle covering a range of $\theta=0°$ to $165°$.

As already described above, the device under test 18 may be a large object which cannot be placed within the placement zone 16 in the desired manner, namely centered in the placement zone 16, so that the at least one antenna 20 of the device under test 18 may be displaced to a coordinate center C of the placement zone 16 towards which the measurement antenna 12 is orientated.

In other words, the antenna 20 is off-centered with respect to the center of the placement zone 16, namely the coordinate center C being the origin of an initial coordinate system used for determining the radiation pattern of the device under test 18.

Thus, an offset 28 occurs between the at least one antenna 20 of the device under test 18 with respect to the center of the placement zone 16, namely the coordinate center C of the respective measurement(s).

As discussed above, the coordinate center C corresponds to the center of the coordinate system describing the measurement points used for characterizing the transmission and/or receiving properties of the device under test 18, namely the three-dimensional radiation pattern of the antenna 20, particularly a spherical three-dimensional measurement of the radiation pattern of the antenna 20. Accordingly, the measurement points are assigned to a spherical grid around the coordinate center C or rather a coordinate surface centered about the coordinate center C.

However, the antenna 20 of the device under test 18 is displaced with regard to the center of the sphere of measurement points because the antenna 20 is displaced with respect to the coordinate center C.

Figure 3:
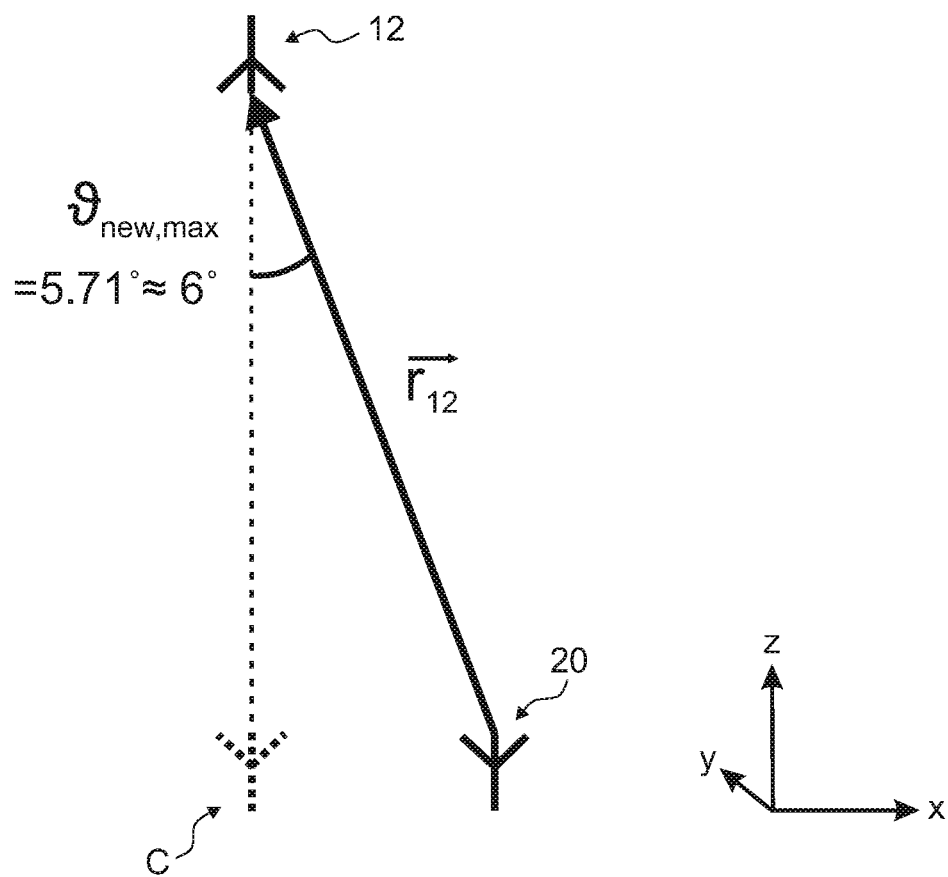
FIG. 3 schematically illustrates a displaced antenna of the device under test.

The respective situation is shown in FIG. 3 illustrating the displaced antenna 20 of the device under test 18 with respect to the coordinate center C and the measurement antenna 12.

Figure 2:
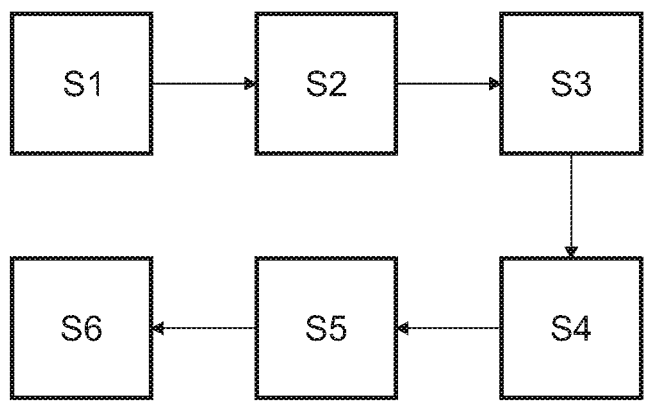
FIG. 2 shows a flow-chart illustrating a method for correcting a radiation pattern according to the present disclosure.

The system 10 shown in FIG. 1 can be used to perform a method for correcting a radiation pattern that is schematically illustrated by the flow-chart shown in FIG. 2 to which reference is made hereinafter.

In a first step S1, the device under test 18 with the at least one antenna 20 is located in the placement zone 16 wherein the at least one antenna 20 of the device under test 18 is located in the far-field. Particularly, the device under test 18 is located in the direct far-field. Thus, no hardware near-field transformations are used for accelerating the space convergence of the radiation pattern from near-field to far-field which relates to an indirect far-field method.

In a second step S2, a radiation pattern of the device under test 18 is measured via the measurement antenna 12 even though the at least one antenna 20 of the device under test 18 is located displaced to the coordinate center C of the placement zone 16. In other words, the antenna 20 is off-centered to the respective initial coordinate system having its origin in the coordinate center C.

For compensating the offset 28 of the at least one antenna 20 of the device under test 18 with respect to the coordinate center C, several compensating steps are performed as will be discussed hereinafter.

In a third step S3, a corrected measurement antenna pattern of the measurement antenna 12 is determined. In fact, the offset 28 yields in different characteristics of the measurement antenna 12 when interacting with the displaced antenna 20 because the measurement antenna 12 is orientated towards the coordinate center C assumed to coincidence with the antenna 20 of the device under test 18.

Due to the offset 28, the measurement antenna 12 is not perfectly orientated towards the antenna 20 of the device under test 18 resulting in deviations, in particular angular orientations when the measurement antenna 12 and/or the device under test 18 is moved during the measurement(s). For correcting these deviations, the corrected measurement antenna pattern is determined as will be described later in more detail.

In a fourth step S4, the correct measurement antenna pattern determined is applied on the measured radiation pattern of the device under test 18 to obtain a corrected radiation pattern of the device under test 18. Hence, the orientation of the measurement antenna 12 is mathematically corrected so as to emulate an orientation of the measurement antenna 12 towards the real location of the at least one antenna 20 of the device under test 18.

Accordingly, deviations from the boresight direction of the measurement antenna pattern, namely the initial orientation of the measurement antenna 12, are corrected (pattern correction). In other words, steps S3 and S4 relate to a probe correction or rather a measurement antenna pattern correction.

For determining the corrected measurement antenna in step S3, spherical coordinates are calculated that define the relative orientation between the measurement antenna 12 and the at least one antenna 20 of the device under test 18.

The respective relative orientation defined in spherical coordinates can be taken in relation to the measurement points assigned to the radiation pattern of the device under test 18 because the radiation pattern is measured on a spherical grid. The spherical grid of measurement points is centered around the coordinate center C assumed to coincidence with the antenna 20 of the device under test 18.

However, the antenna 20 is displaced with respect to the coordinate center C so that the spherical grid of measurement points is not centered around the antenna 20 even though the grid may surround the device under test 18.

In fact, the spherical coordinates describing the relative orientation between the measurement antenna 12 and the antenna 20 of the device under test 18 may be used to describe the measurement antenna pattern of the measurement antenna 12, namely the antenna pattern having the origin at the location of the measurement antenna 12.

Once the spherical coordinates are calculated, the spherical coordinates are used to determine the corrected measurement antenna pattern of the measurement antenna 12.

The corrected measurement antenna pattern corresponds to the difference between a measurement antenna boresight gain, namely the radiation pattern measurement under the assumption that the antenna 20 is located in the coordinate center C, and the measurement antenna pattern at the spherical coordinates calculated, namely the relative orientation between the measurement antenna 12 and the antenna 20.

In other words, the deviations in the measurement characteristics of the measurement antenna 12 due to the off-centered antenna 20 of the device under test 18 are corrected by the corrected measurement antenna pattern which is applied on the measured radiation pattern of the device under test 18.

Thus, the occurring deviations are compensated appropriately.

The spherical coordinates may be calculated based on a vector between the measurement antenna 12 and the at least one antenna 20 of the device under test 18. The vector defines the relative orientation between the measurement antenna 12 and the antenna 20 of the device under test 18 in Cartesian coordinates.

The vector may be determined by calculating the offset 28 of the at least one antenna 20, namely the DUT antenna, with respect to the coordinate center C as well as the offset of the measurement antenna 12 with respect to the coordinate center C which typically corresponds to an offset in one dimension, for instance z-direction as shown in FIG. 3.

The vector describing the distance between the measurement antenna 12 and the antenna 20 in Cartesian coordinates may be transformed into spherical coordinates.

The spherical coordinates are inter alia used to calculate points on the sphere surrounding the antenna 20 of the device under test 18 to compensate the offset 28.

These points may be used to determine the corrected measurement antenna pattern.

Moreover, a coordinate system transformation may be done by which the original measurement points, namely the ones encircling the coordinate center C, are transformed from the initial coordinate system with its origin at the coordinate center C of the placement zone 16 to another coordinate system with an antenna coordinate center. The antenna coordinate center may be assigned to the measurement antenna 12 so that the origin of the antenna coordinate system is located at the position of the measurement antenna 12.

Accordingly, a coordinate system transformation takes place because the origin of the respective coordinate system is shifted from the initial coordinate center C to the respective location of the measurement antenna 12.

The previously calculated spherical coordinates assigned to the original coordinate system may be used in the measurement antenna pattern obtained to determine the corrected measurement antenna pattern, namely the one that is orientated towards the antenna 20.

The measurement antenna pattern obtained may be interpolated to obtain the respective values at the spherical coordinates calculated previously which define the relative orientation between the measurement antenna 12 and the antenna 20.

Moreover, the measurement antenna pattern obtained may be normalized.

In addition, deviations of the radiation pattern of the off-centered antenna 20 of the device under test 18 at the measurement antenna 12 are compensated appropriately. In fact, the radiation pattern of the antenna 20 is not orientated towards the measurement antenna 12 but displaced by the offset 28 leading to angular deviations which can be compensated by taking the spherical coordinates calculated into account that describe the relative orientation of the measurement antenna 12 with respect to the antenna 20 of the device under test 18.

For this purpose, a coordinate system transformation is done (again) so that the respective measurement points of the grid, namely the spherical three-dimensional grid, surrounding the coordinate center C are transformed to a grid centered around the real location of the antenna 20 of the device under test 18. This coordinate transformation relates to a fifth step S5.

Hence, the antenna coordinate center is assigned to the location of the antenna 20 so that the origin of the antenna coordinate system coincidences with the location of the DUT antenna 20.

The measured radiation pattern of the device under test 18 is used. However, the real relative orientation is taken into account by using the spherical coordinates describing the relative orientation between the measurement antenna 12 and the antenna 20 of the device under test 18 instead of the orientation between the measurement antenna 12 and the coordinate center C.

In other words, a geometrical compensation is applied so that measurement data acquired on the coordinate surface assigned to the displaced device under test 18 can be extrapolated numerically to data on a coordinate surface that is centered on the device under test 18, namely the at least one antenna 20.

This is ensured by the coordinate system transformation.

The coordinate surface obtained by the coordinate system transformation may be interpolated to obtain a regular grid of points over the surface obtained after the coordinate system transformation.

Besides the corrected measurement antenna pattern and the coordinate system transformation, an occurring path loss is determined and compensated in a sixth step S6. In fact, the fifth step is assigned to a path loss compensation.

Because the antenna 20 of the device under test 18 is located offset with respect to the coordinate center C of the placement zone 16 to which the measurement antenna 12 is orientated, a path loss occurs due to the larger distance between the measurement antenna 12 and the at least one antenna 20.

The respective path loss can be determined by using the Friis transmission equation.

In fact, the path loss may be determined for every position and normalize to the initial measurement distance.

For determining the path loss the spherical coordinates calculated may be used that correspond to the relative orientation between the measurement antenna 12 and the at least one antenna 20 of the device under test 18. For instance, the coordinate system assigned to the measurement antenna 12 or rather the coordinate system assigned to the antenna 20 may be used as both describe the relative orientation between each other.

The path loss may be compensated when applying the corrected measurement antenna pattern. Further, path loss compensation due to the offset 28 may be performed simultaneously with the coordinate transformation. Thus, variable propagation distances can be corrected appropriately.

Generally, steps S3 and S4, S5 as well as S6 may be done in a different order.

After all these steps, the corrected measurement antenna pattern is obtained as well as the path loss which are applied on the measured radiation pattern of the device under test 18 wherein the spherical coordinates describing the relative orientation between the measurement antenna 12 and the antenna 20 of the device under test 18 are used in the measured radiation pattern of the device under test 18 so that the corrected radiation pattern of the device under test 18 is obtained. This is shown by the following equation:

$$C_{corr}(\vartheta_{new}, \varphi_{new}) = C(\vartheta_{new}, \varphi_{new}) * C_{probe}(\vartheta_{new}, \varphi_{new}) / L_s (\vartheta_{new}, \varphi_{new}),$$

wherein $C_{corr}$ corresponds to the corrected radiation pattern of the device under test 18, $\vartheta_{new}, \varphi_{new}$ correspond to the angles of the spherical coordinates calculated, namely after the coordinate system transformation, C corresponds to the measured radiation pattern of the device under test 18, $C_{probe}$ corresponds to the corrected measurement antenna pattern and $L_s$ is used for normalization purposes. $L_s$ can be determined as follows:

$$\|\vec{r}_{12}(\vartheta_{new}, \varphi_{new})\| = L_s(\vartheta_{new}, \varphi_{new})$$

The corrected radiation pattern of the device under test 18 is calculated point-wisely. Afterwards, the corrected radiation pattern of the device under test 18 is interpolated and/or extrapolated to map to a regularly spaced grid centered around the location of the device under test 18.

In fact, the radiation pattern of the device under test 18 comprises the path loss compensation as well as a phase compensation which, however, is independent of any knowledge of the phase because only amplitude data is used. This enables full over-the-air characterization without requiring any phase measurement.

The radiation pattern of the device under test 18, namely the far-field E-field pattern, in the coordinate system at the antenna coordinate center can be defined by the following equation:

$$G(R0, \vartheta 2, \varphi 2) = e^{jk(R0-R2)} \frac{R0}{R2} * F(R1, \vartheta 1, \varphi 1),$$

wherein R0 corresponds to the radius of the sphere on which data are to be observed, and wherein $F(R1, \vartheta 1, \varphi 1)$ is the originally measured radiation pattern in the coordinate system with the origin at the coordinate center C. Hence, the original measurement points are defined by the spherical coordinates R1, $\vartheta 1$, $\varphi 1$.

In contrast thereto, the transformed coordinate system yields the spherical coordinates R2, $\vartheta 2$, $\varphi 2$ which are used by the radiation pattern in the coordinate system with the origin at the antenna 20.

In other words, a new far-field electromagnetic field pattern of the device under test 18, namely its antenna 20, can be created based on the originally measured one that was gathered under the assumption that the antenna 20 is located in the coordinate center C of the placement zone 16.

The offset 28 with respect to the coordinate center C is taken into account by two factors that apply on the originally gathered radiation pattern wherein the first factor takes phase deviations into account and the second factor takes the occurring path loss into account due to the different distance between the antenna 20 and the measurement antenna 12.

As can be seen by the equation above, no phase information is required because only amplitude information is taken into account.

Put it another way, the antenna 20 of the device under test 18 is off-centered by the offset 28 wherein the relative orientation of the measurement antenna 12 with respect to the antenna 20 changes with regard to the respective position of the measurement antenna 12 on the coordinate surface, namely a sphere.

As a consequence, various angular regions of the measurement antenna pattern contribute to the transmission or rather receiving measurements while the measurement antenna 12 and/or the device under test 18 is moved during measurement, in particular rotated.

In order to compensate for these variations, the measurement antenna compensation, namely the corrected measurement antenna pattern, is introduced that compensates the variations due to the measurement antenna pattern with the respective measurement angle applied.

In fact, phase knowledge of the respective electromagnetic field, in particular the respective radiation pattern, is not required. Accordingly, testing of all sorts of quantities related to full performance testing over-the-air is enabled.

Furthermore, the method is cost-effective because no reflector or antenna array is required because a respective measurement can be done by a single measurement antenna 12.

Therefore, more compact environments are sufficient for conducting the respective method.

In fact, the control and processing module 14 of the system 10 is configured to perform the respective steps mentioned above.

Furthermore, a computer program 30 may be assigned to the control and processing module 14. The computer program 30 may comprise a program code that is adapted to cause the system 10 to perform the steps mentioned above, when the computer program is run on the control and processing module 14.

In other words, three main error mechanisms, namely a coordinate system offset, a path length difference as well as deviations from boresight direction of the measurement antenna pattern are compensated or rather corrected by the method applied and described above which takes the path loss as well as the measurement antenna pattern into account.

Generally, the interpolation method may be a natural one whereas the extrapolation method may be a linear one.

Furthermore, a threshold value may be applied so that only measurement points are taken into account exceeding the respective threshold, for instance a threshold of 3 dB.

During the measurement, the distance between the measurement antenna 12 and the coordinate center C of the placement zone 16 is constant. Thus, the coordinate center C is assigned to the axis of rotation of the turntable 24. In other words, the coordinate center C coincidences with the axis of rotation of the turntable 24.

For measuring purposes, signals having a frequency higher than 6 GHz, in particular higher than 27 GHz, are used.

Because a corrected measurement antenna pattern is determined, an asymmetric measurement antenna pattern is made symmetrical by applying the respective corrected measurement antenna pattern on the antenna pattern of the device under test 18.

The control unit may include, in some embodiments, logic for implementing the technologies and methodologies described herein. This logic of the control unit can be carried out in either hardware or software, or a combination of hardware and software. In some embodiments, the control unit includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control unit includes a microprocessor and a memory storing logic modules and/or instructions. In an embodiment, the control unit includes one or more ASICs having a plurality of predefined logic components. In an embodiment, the control unit includes one or more FPGA having a plurality of programmable logic components. In an embodiment, the control unit includes hardware circuit implementations (e.g., implementations in analog circuitry, implementations in digital circuitry, and the like, and combinations thereof). In an embodiment, the control unit includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method for correcting a radiation pattern by using a system comprising a device under test with at least one antenna and a measurement antenna, the method comprising the steps of:
    locating the device under test in a placement zone, the at least one antenna of the device under test being located in the far-field;
    measuring a radiation pattern of the device under test received via the measurement antenna;
    determining a corrected measurement antenna pattern to compensate for an offset of the at least one antenna of the device under test with respect to a coordinate center of the placement zone towards which the measurement antenna is orientated; and
    applying the corrected measurement antenna pattern on the measured radiation pattern of the device under test to obtain a corrected radiation pattern of the device under test, wherein the measured radiation pattern of the device under test is corrected by the corrected measurement antenna pattern applied to compensate the offset between the at least one antenna of the device under test as well as the coordinate center of the placement zone.

2. The method according to claim 1, wherein a vector between the measurement antenna and the at least one antenna of the device under test is calculated.

3. The method according to claim 1, wherein spherical coordinates are calculated defining the relative orientation between the measurement antenna and the at least one antenna of the device under test being off-centered with respect to the coordinate center.

4. The method according to claim 3, wherein the corrected measurement antenna pattern corresponds to the difference between a measurement antenna boresight gain and the measurement antenna pattern at the spherical coordinates calculated.

5. The method according to claim 1, wherein a coordinate system transformation is done by which measurement points are transformed from a coordinate system with the coordinate center of the placement zone to another coordinate system with an antenna coordinate center.

6. The method according to claim 5, wherein the radiation pattern of the device under test obtained after the coordinate system transformation is interpolated to obtain a regular grid of measurement points.

7. The method according to claim 1, wherein a path loss due to the offset of the at least one antenna of the device under test with respect to the coordinate center of the placement zone is determined, and wherein the path loss is compensated in the corrected radiation pattern of the device under test.

8. The method according to claim 7, wherein the path loss is compensated while at least one of applying the corrected measurement antenna pattern on the measured radiation pattern of the device under test to obtain the corrected radiation pattern of the device under test and doing the coordinate system transformation.

9. The method according to claim 1, wherein the corrected radiation pattern of the device under test obtained is at least one of interpolated and extrapolated to obtain a regularly spaced grid of measurement points.

10. The method according to claim 1, wherein the radiation pattern of the device under test is measured on a spherical grid.

11. The method according to claim 1, wherein the distance between the measurement antenna and the coordinate center of the placement zone is constant during the measurement.

12. The method according to claim 1, wherein the measurement is performed with signals having a frequency higher than 6 GHz.

13. The method according to claim 1, wherein only amplitude information is taken into account.

14. The method according to claim 1, wherein an asymmetric measurement antenna pattern is made symmetrical.

15. The method according to claim 1, wherein only a single measurement antenna is used for measuring the radiation pattern.

16. A system for correcting a radiation pattern, comprising a placement zone, a measurement antenna, a control and processing module as well as a device under test with at least one antenna, wherein at least the measurement antenna is connected with the control and processing module, the control and processing module being configured to:
measure a radiation pattern of the device under test received via the measurement antenna;
determine a corrected measurement antenna pattern to compensate for an offset of the at least one antenna of the device under test with respect to a coordinate center of the placement zone towards which the measurement antenna is orientated; and
apply the corrected measurement antenna pattern on the measured radiation pattern of the device under test to obtain a corrected radiation pattern of the device under test, wherein the measured radiation pattern of the device under test is corrected by the corrected measurement antenna pattern applied to compensate the offset between the at least one antenna of the device under test as well as the coordinate center of the placement zone.

17. The system according to claim 16, wherein the measurement system has a positioning system that comprises at least one of a movable arm and a turntable.

18. A computer program for correcting a radiation pattern using a system with a placement zone, a measurement antenna, a control and processing module as well as a device under test with at least one antenna, the computer program comprising a program code being adapted to cause the system to perform the following steps when the computer program is run on the control and processing module:
measuring a radiation pattern of the device under test received via the measurement antenna;
determining a corrected measurement antenna pattern to compensate for an offset of the at least one antenna of the device under test with respect to a coordinate center of the placement zone towards which the measurement antenna is orientated; and
applying the corrected measurement antenna pattern on the measured radiation pattern of the device under test to obtain a corrected radiation pattern of the device under test,
wherein spherical coordinates are calculated defining the relative orientation between the measurement antenna and the at least one antenna of the device under test being off-centered with respect to the coordinate center or wherein a coordinate system transformation is done by which measurement points are transformed from a coordinate system with the coordinate center of the placement zone to another coordinate system with an antenna coordinate center.

* * * * *